United States Patent
Roy

[11] Patent Number: 6,017,780
[45] Date of Patent: Jan. 25, 2000

[54] PASSIVATION SCHEME FOR LCD AND OTHER APPLICATIONS

[75] Inventor: Sudipto Ranendra Roy, Singapore, Singapore

[73] Assignee: Chartered Semiconductor Manufacturing, Ltd., Singapore, Singapore

[21] Appl. No.: 09/110,423

[22] Filed: Jul. 6, 1998

[51] Int. Cl.[7] .................................................. H01L 21/00
[52] U.S. Cl. ........................ 438/152; 438/622; 438/633
[58] Field of Search .............................. 438/152, 30, 622, 438/632, 633, 629

[56] References Cited

U.S. PATENT DOCUMENTS

| | | | |
|---|---|---|---|
| 5,056,895 | 10/1991 | Kahn | 359/87 |
| 5,435,888 | 7/1995 | Kalnitsky et al. | 156/636 |
| 5,516,729 | 5/1996 | Dawson et al. | 437/228 |
| 5,592,318 | 1/1997 | Majima et al. | 349/122 |
| 5,645,216 | 7/1997 | Adrian | 438/627 |
| 5,663,108 | 9/1997 | Lin | 438/624 |
| 5,681,425 | 10/1997 | Chen | 156/643.1 |
| 5,686,790 | 11/1997 | Curtin et al. | 313/493 |
| 5,696,386 | 12/1997 | Yamazaki | 257/57 |
| 5,708,486 | 1/1998 | Miyawaki et al. | 341/44 |
| 5,721,601 | 2/1998 | Yamaji et al. | 349/138 |
| 5,817,571 | 10/1998 | Yu et al. | 438/622 |
| 5,849,637 | 12/1998 | Wang | 438/699 |
| 5,850,105 | 12/1998 | Dawson et al. | 257/758 |
| 5,858,870 | 1/1999 | Zheng et al. | 438/622 |
| 5,928,960 | 7/1999 | Greco et al. | 438/692 |
| 5,930,677 | 7/1999 | Zheng et al. | 438/782 |

*Primary Examiner*—John F. Niebling
*Assistant Examiner*—Michael S. Lebentritt
*Attorney, Agent, or Firm*—George O. Saile; Rosemary L.S. Pike

[57] ABSTRACT

A process for planarizing a passivation layer in order to maintain a uniform gap between the passivation layer of a bottom substrate and the top substrate of a LCD integrated circuit device is described. Semiconductor device structures in and on a semiconductor substrate wherein the semiconductor device structures are covered by an insulating layer. A metal layer is deposited and patterned to form metal lines wherein there is a gap between two of the metal lines. A passivation layer is deposited overlying the metal lines wherein the gap is not filled by the passivation layer. A layer of high density plasma oxide is deposited overlying the passivation layer and polished to leave the high density plasma oxide within the gap and to leave a planarized passivation layer surface. This will also a precise gap to be maintained in which to build the liquid crystal display material between the top substrate and the passivation layer of the bottom substrate.

26 Claims, 3 Drawing Sheets

6,017,780

PASSIVATION SCHEME FOR LCD AND OTHER APPLICATIONS

RELATED PATENT APPLICATION

1) U.S. patent application Ser. No. 09/151,948 filed Sep. 11, 1998 (CS-98-020) to S. R. Roy.

BACKGROUND OF THE INVENTION (1) Field of the Invention

The present invention relates to the fabrication of LCD integrated circuit devices, and more particularly, to a method of passivating the passivation layer of an LCD integrated circuit device in order to maintain a uniform gap height between the top and bottom substrates.

Liquid crystal displays (LCD) have been used in the art for such applications as computer and television screens. Typically, the topmost level fabricated on a bottom substrate is a series of metal pixels, 19×19 microns in area. There are typically 1024×768 pixels having a spacing of 0.7 microns between each pixel. The liquid crystal display layer is built on this array of metal pixels and enclosed by a top substrate comprising a transparent material FIG. 1 illustrates a LCD integrated circuit device of the prior art. Bottom semiconductor substrate 10 is illustrated. First metal lines 22 are formed overlying a barrier/glue layer. An anti-reflective coating (ARC) layer 24 may be formed over the metal lines 22. An insulating layer 26 is deposited over the metal lines. Tungsten plugs 28 are formed within openings through the insulating layer to the metal lines 22. A second level of metal lines 32, usually an aluminum alloy, are formed overlying a second barrier layer 30. The aluminum alloy is separated and protected by a passivation layer, typically 1000 Angstroms of undoped silicate glass (USG) 34 followed by 2500 Angstroms of silicon nitride 36. The liquid crystal material 52 lies between the passivation layer and the top substrate 56.

For good performance, high speed, and sharp display in the LCD, it is critical to maintain a uniform gap between the top and bottom substrate. The crucial gap height is not maintained in the process of the prior art. As seen in FIG. 1, the height A above the metal pixels is not the same as the height B between the metal pixels.

There are a number of patents in the field of LCD's. For example, U.S. Pat. No. 5,696,386 to Yamazaki, U.S. Pat. No. 5,708,486 to Miyakawaki et al, and U.S. Pat. No. 5,868,790 to Curtain et al discuss LCD formations in which the gap width is non-constant. U.S. Pat. No. 5,056,895 to Kahn teaches an insulating leveling layer of polymer or spin-on-glass. U.S. Pat. No. 5,721,601 to Yamaji et al discloses a spin-on-glass planarizing film. U.S. Pat. No. 5,592,318 to Majima et al teaches planarizing with a polyimide resin.

SUMMARY OF THE INVENTION

Accordingly, a primary object of the invention is to provide a process for maintaining a uniform gap between the passivation layer of a bottom substrate and the top substrate of a LCD integrated circuit device.

A further object of the invention is to provide a process for planarizing a passivation layer in the fabrication of an integrated circuit device.

Another object is to provide a process for planarizing a passivation layer in order to maintain a uniform gap between the passivation layer of a bottom substrate and the top substrate of a LCD integrated circuit device.

Yet another object of the invention is to provide a process for planarizing a passivation layer using HDP oxide in order to maintain a uniform gap between the passivation layer of a bottom substrate and the top substrate of a LCD integrated circuit device.

In accordance with the objects of the invention, a process for planarizing a passivation layer in order to maintain a uniform gap between the passivation layer of a bottom substrate and the top substrate of a LCD integrated circuit device is achieved. A metal layer is deposited over an insulating layer on a semiconductor substrate and patterned to form metal lines wherein there is a gap between two of the metal lines. A passivation layer is deposited overlying the metal lines wherein the gap is not filled by the passivation layer. A layer of high density plasma oxide is deposited overlying the passivation layer and polished to leave the high density plasma oxide within the gap and to leave a planarized passivation layer surface. This will allow a precise gap to be maintained in which to build the liquid crystal display material between the top substrate and the passivation layer of the bottom substrate.

BRIEF DESCRIPTION OF THE DRAWINGS

In the accompanying drawings forming a material part of this description, there is shown:

FIGS. 2–4 are cross-sectional representations of a preferred embodiment of the present invention.

DESCRIPTION OF THE PREFERRED EMBODIMENTS

The process of the present invention can be used in any application in which a planarized passivation layer is critical. An example of an application in which a planarized passivation layer is crucial is in making a liquid crystal display (LCD) device. The invention will be described in connection with an LCD device application. However, it is to be understood that the invention is not limited to the LCD device application, but may be used in any application in which the passivation layer is to be planarized.

Figure 1:
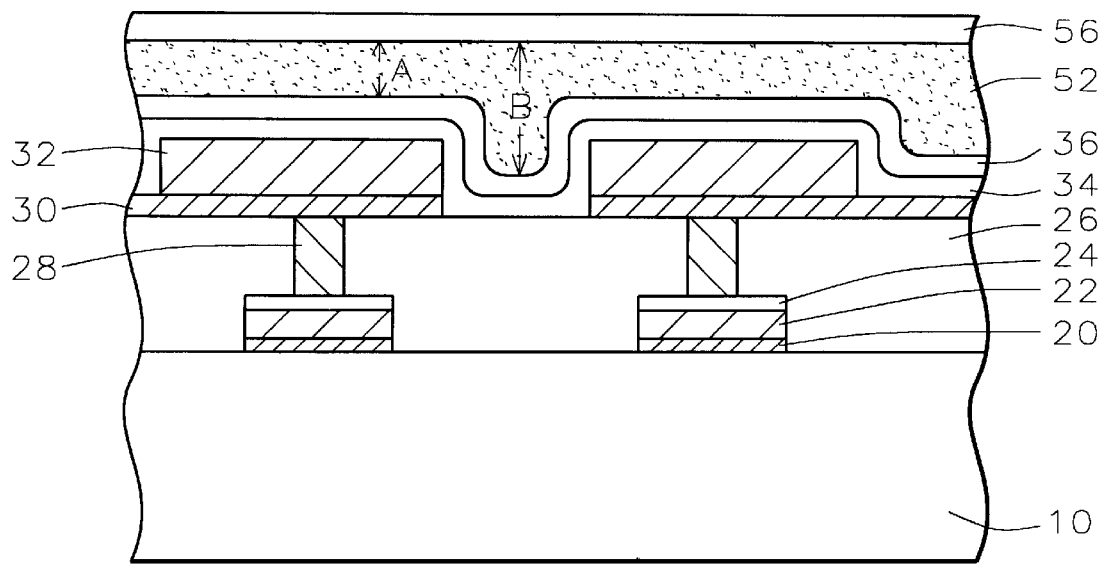
FIG. 1 is a cross-sectional representation of an LCD device of the prior art.
Figure 2:
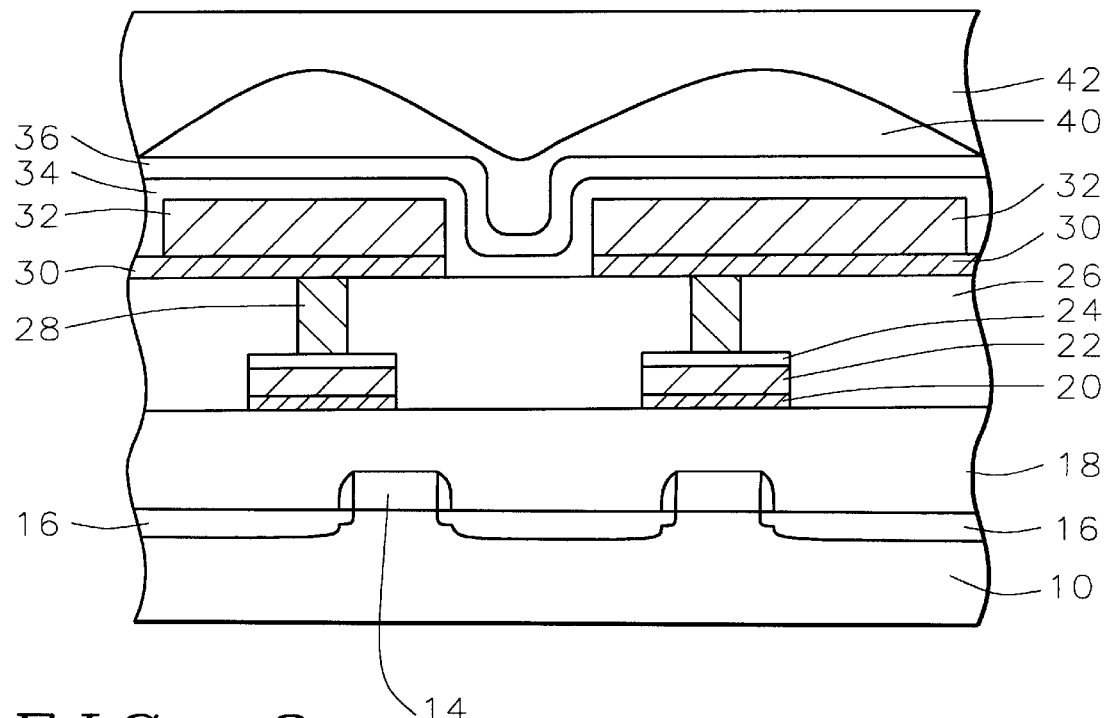

Referring now more particularly to FIG. 2, there is shown a semiconductor substrate 10, preferably composed of monocrystalline silicon. Semiconductor device structures which may include polysilicon gate electrodes 14 and source and drain regions 16 are shown. An insulating layer 18 is formed overlying the semiconductor device structures. In a simple application such as an on/off operation, semiconductor device structures are unnecessary. However, for precise control, speed, etc., such as in required for television, these structures are necessary.

A barrier/glue layer 20, comprising titanium/titanium nitride is deposited over the insulating layer 18. A layer of conducting material, such as aluminum or an aluminum alloy, is deposited over the barrier/glue layer and patterned to form metal lines 22. An antireflective coating (ARC) layer 24 may be deposited over the metal layer before patterning. An insulating layer 26, such as silicon dioxide, undoped silicate glass (USG), a tetraethoxysilane (TEOS) oxide, or the like, is deposited over the metal lines. Openings are etched through the insulating layer 26 to the metal lines. A tungsten layer is deposited over the insulating layer and within the opening and then etched back to form tungsten plugs 28. A second barrier layer 30 and metal layer 32 is deposited over the insulating layer 26. The metal layer is typically aluminum or an aluminum alloy. The metal layer is patterned to form the metal pixels 32. An ARC coating, not shown, may also be used, but for applications involving a highly reflective surface, an ARC is not needed.

The passivation layer is formed as is conventional in the art. For example, undoped silicate glass (USG) 34 is deposited over the metal pixels 32 to a thickness of between about 500 and 1000 Angstroms. A silicon nitride layer 36 is deposited over the USG layer to a thickness of 2000 and 3000 Angstroms.

Now the novel passivation scheme of the present invention will be described. A layer of high density plasma (HDP) oxide 40 is deposited by chemical vapor deposition (HDPCVD) to a thickness of between about 6000 and 8000 Angstroms over the passivation layer and filling the gap between the metal pixels.

HDP oxide is deposited as a result of simultaneous sequenced deposition and sputtering. Because of the characteristics of the HDPCVD deposition, the oxide overlying the metal pixels is thicker toward the middle of the metal pixels and thinner toward the edge of the metal pixels and over the gap between the metal pixels. This results in the filling of the gap between the pixels and an almost triangular dome formed above the pixels. For example, the thickness of the HDP oxide over the gap may be 0 to 500 Angstroms, measured from the level of the top of the metal pixels, and the thickness of the HDP oxide over the middle of the metal pixels may be 6000 to 8000 Angstroms.

Next, a layer of tetraethoxysilane (TEOS) oxide 42 is deposited over the HDP oxide layer by plasma enhanced chemical vapor deposition (PECVD) to a thickness of between about 10,000 and 12,000 Angstroms.

Figure 3A:
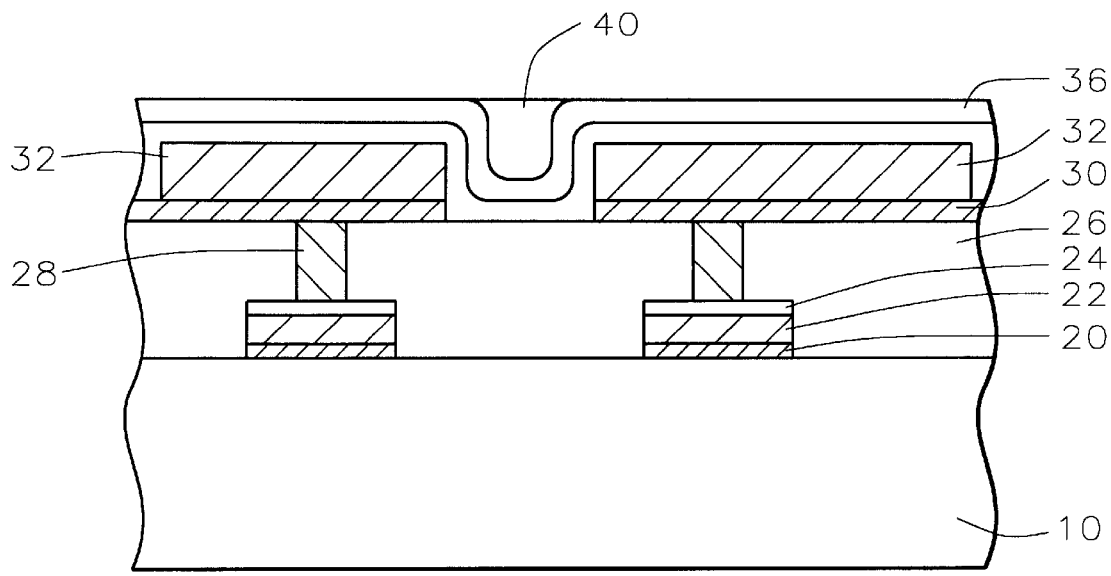
FIGS. 3A through 3C are cross-sectional representations of three alternatives in a preferred embodiment of the present invention.

Referring to FIG. 3A, the PE-TEOS layer 42 and HDP oxide layer 40 are planarized and removed using chemical mechanical polishing (CMP). This leaves the HDP oxide 40 within the gap between the pixels, as shown.

Since the top surface of the bottom electrode is planarized, the gap between the top and bottom electrodes which is to be filled with the liquid crystal material will be uniform. The top electrode may be planarized as well by the process of the present invention.

Alternatively, the PE-TEOS deposition step may be eliminated. The CMP step may be performed immediately following the HDP oxide deposition. This will still result in the filling of the gap with the HDP oxide 40 as shown in FIG. 3A.

The PE-TEOS layer gives a smooth surface to be planarized before the CMP step so that the gap fill is continuous and flat after CMP. The PE-TEOS layer also helps to fill any voids or seams.

Figure 3B:
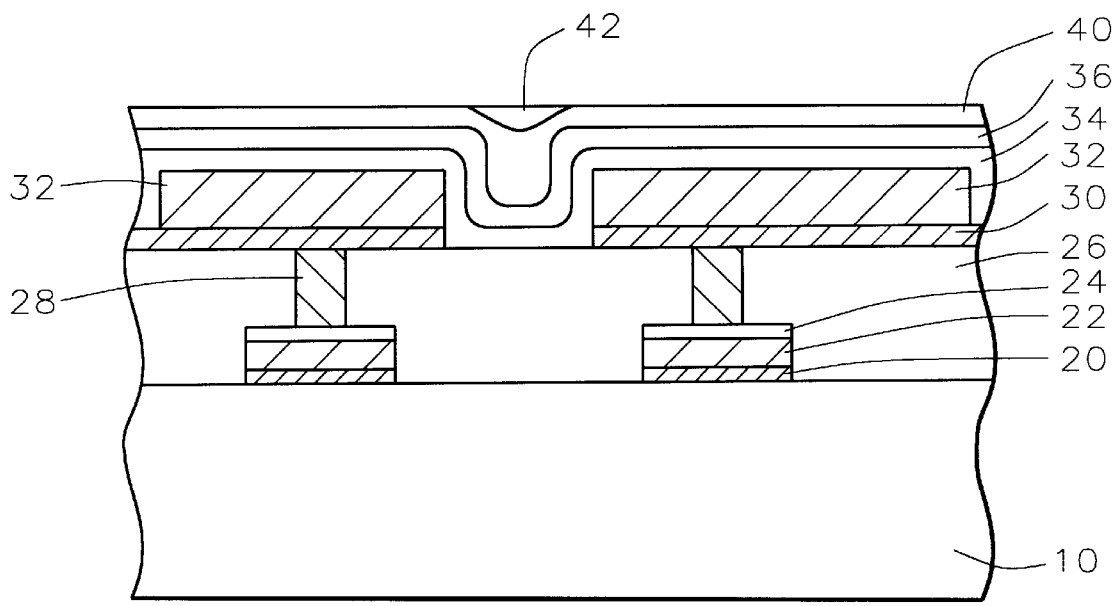
Figure 3C:
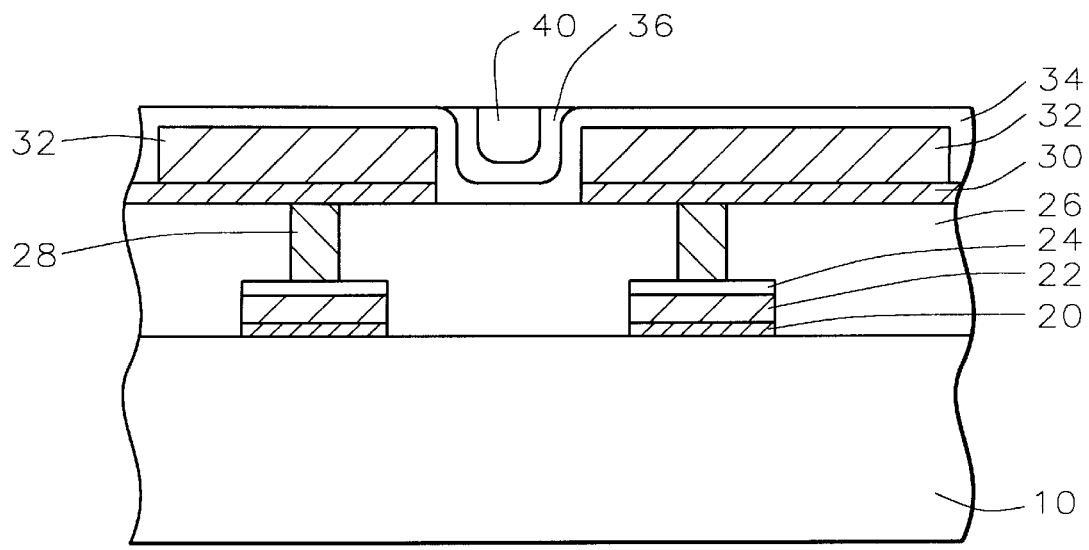

FIGS. 3B and 3C illustrate polish stop alternatives. The CMP polish stop is at the silicon nitride layer in FIG. 3A. The CMP polish stop may be in the PE-TEOS layer, as illustrated in FIG. 3B, or at the USG layer, as shown in FIG. 3C. The new passivation film may comprise any combination of PE-TEOS oxide, HDP oxide, silicon nitride, and USG.

Figure 4:
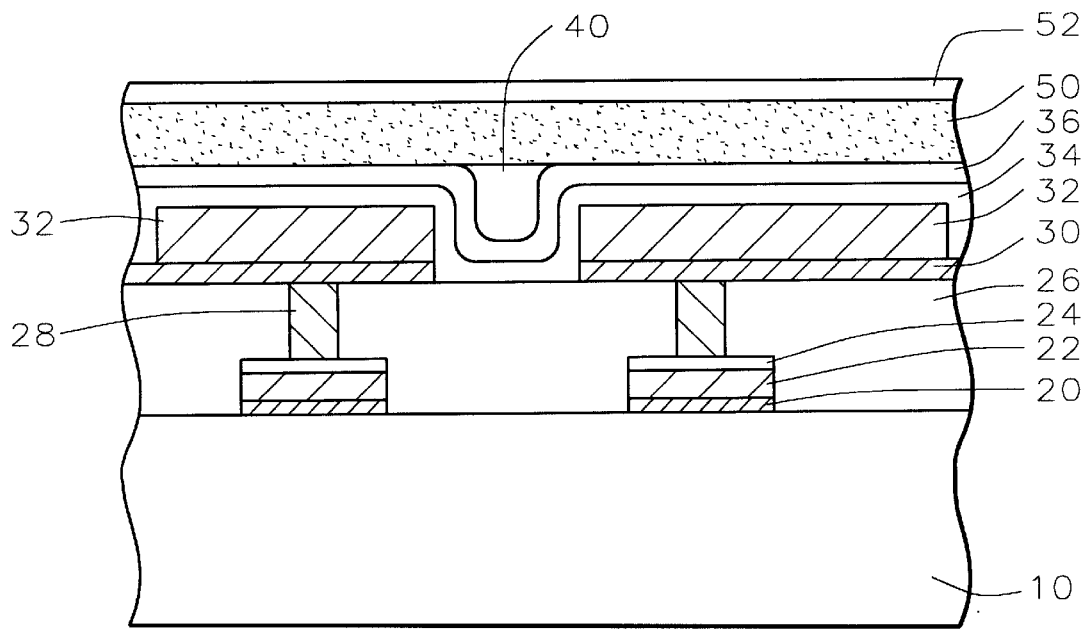

Referring now to FIG. 4, since the surface of the bottom substrate has been planarized, the top substrate 52 lies at a precise distance from the top of the bottom substrate. The liquid crystal material 50 fills the gap between the two substrates. The process of the present invention may also be used to planarize the surface of the top substrate in the same way.

The process of the present invention uses HDP oxide deposition and chemical mechanical polishing to planarize the passivation layer of a substrate. The LCD is built on this surface which allows a precise gap between the top and bottom substrates.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing an insulating layer overlying a semiconductor substrate;

depositing and patterning a metal layer overlying said insulating layer to form metal lines wherein there is a gap between two of said metal lines;

depositing a passivation layer overlying said metal lines wherein said gap is not filled by said passivation layer;

depositing a layer of high density plasma oxide overlying said passivation layer; and polishing said high density plasma oxide layer to leave said high density plasma oxide filling said gap and to leave a planarized passivation layer surface to complete the fabrication of said integrated circuit device.

2. The method according to claim 1 wherein said semiconductor device structures including gate electrodes and associated source and drain regions and multiple layers of metal lines and intermetal dielectric are formed in and on said semiconductor substrate underlying said insulating layer.

3. The method according to claim 1 wherein said integrated circuit device is a liquid crystal display and wherein said metal lines are pixels and further comprising:

forming a liquid crystal material layer overlying said planarized passivation layer; and attaching a second semiconductor substrate overlying said liquid crystal material layer.

4. The method according to claim 1 wherein said step of depositing said passivation layer comprises:

depositing a first conformal layer of undoped silicate glass overlying said metal lines; and depositing as second layer of silicon nitride overlying said undoped silicate glass layer.

5. The method according to claim 4 wherein said undoped silicate glass layer has a thickness of between about 500 and 1000 Angstroms.

6. The method according to claim 4 wherein said silicon nitride layer has a thickness of between about 2000 and 3000 Angstroms.

7. The method according to claim 1 further comprising depositing a layer of tetraethoxysilane (TEOS) oxide overlying said high density plasma oxide and wherein said polishing step polishes both said TEOS oxide layer and said high density plasma oxide layer.

8. The method according to claim 1 wherein said step of polishing said high density plasma oxide layer is performed by chemical mechanical polishing.

9. The method according to claim 1 wherein said step of polishing said high density plasma oxide layer has a polish stop within said high density plasma oxide layer.

10. The method according to claim 7 wherein said step of polishing said high density plasma oxide layer has a polish stop within said TEOS oxide layer.

11. The method according to claim 1 wherein said step of polishing said high density plasma oxide layer has a polish stop at said passivation layer.

12. The method according to claim 4 wherein said step of polishing said high density plasma oxide layer has a polish stop at said silicon nitride layer.

13. The method according to claim 4 wherein said step of polishing said high density plasma oxide layer has a polish stop at said undoped silicate glass layer.

14. A method of fabricating a liquid crystal display integrated circuit device comprising:

providing semiconductor device structures in and on a semiconductor substrate wherein said semiconductor device structures are covered by an insulating layer;

depositing and patterning a metal layer overlying said insulating layer to form pixels wherein there is a gap between two of said pixels;

depositing a passivation layer overlying said pixels wherein said gap is not filled by said passivation layer;

depositing a layer of high density plasma oxide overlying said passivation layer;

polishing said high density plasma oxide layer to leave said high density plasma oxide filling said gap and to leave a planarized passivation layer surface;

forming a liquid crystal material layer overlying said planarized passivation layer; and attaching a second semiconductor substrate overlying said liquid crystal material layer to complete the fabrication of said liquid crystal display integrated circuit device.

15. The method according to claim 14 wherein said semiconductor device structures include gate electrodes and associated source and drain regions and multiple layers of metal lines and intermetal dielectric.

16. The method according to claim 14 wherein said step of depositing said passivation layer comprises:

depositing a first conformal layer of undoped silicate glass overlying said metal lines; and depositing as second layer of silicon nitride overlying said undoped silicate glass layer.

17. The method according to claim 14 further comprising depositing a layer of tetraethoxysilane (TEOS) oxide overlying said high density plasma oxide and wherein said polishing step polishes both said TEOS oxide layer and said high density plasma oxide layer.

18. The method according to claim 14 wherein said step of polishing said high density plasma oxide layer is performed by chemical mechanical polishing.

19. A method of fabricating a liquid crystal display integrated circuit device comprising:

providing semiconductor device structures in and on a semiconductor substrate wherein said semiconductor device structures are covered by an insulating layer;

depositing and patterning a metal layer overlying said insulating layer to form pixels wherein there is a gap between two of said pixels;

depositing a passivation layer overlying said pixels wherein said passivation layer comprises a first layer of undoped silicate glass and a second layer of silicon nitride and wherein said gap is not filled by said passivation layer;

depositing a layer of high density plasma oxide overlying said passivation layer;

polishing said high density plasma oxide layer to leave said high density plasma oxide within said gap and to leave a planarized passivation layer surface;

forming a liquid crystal material layer overlying said planarized passivation layer; and attaching a second semiconductor substrate overlying said liquid crystal material layer to complete the fabrication of said liquid crystal display integrated circuit device.

20. The method according to claim 19 wherein said semiconductor device structures include gate electrodes and associated source and drain regions and multiple layers of metal lines and intermetal dielectric.

21. The method according to claim 19 further comprising depositing a layer of tetraethoxysilane (TEOS) oxide overlying said high density plasma oxide and wherein said polishing step polishes both said TEOS oxide layer and said high density plasma oxide layer.

22. The method according to claim 19 wherein said step of polishing said high density plasma oxide layer is performed by chemical mechanical polishing.

23. The method according to claim 19 wherein said step of polishing said high density plasma oxide layer has a polish stop within said high density plasma oxide layer.

24. The method according to claim 21 wherein said step of polishing said high density plasma oxide layer has a polish stop within said TEOS oxide layer.

25. The method according to claim 19 wherein said step of polishing said high density plasma oxide layer has a polish stop at said silicon nitride layer.

26. The method according to claim 19 wherein said step of polishing said high density plasma oxide layer has a polish stop at said undoped silicate glass layer.

* * * * *